United States Patent [19]

Yeh

[11] 4,356,523

[45] Oct. 26, 1982

[54] NARROW TRACK MAGNETORESISTIVE TRANSDUCER ASSEMBLY

[75] Inventor: Nan-Hsiung Yeh, Foster City, Calif.

[73] Assignee: Ampex Corporation, Redwood City, Calif.

[21] Appl. No.: 157,767

[22] Filed: Jun. 9, 1980

[51] Int. Cl.³ .................... G11B 5/12; G11C 11/00; G11B 5/30

[52] U.S. Cl. .................................... 360/113; 365/158

[58] Field of Search ............... 360/113, 122, 126, 127, 360/112; 235/449, 450; 365/157, 158; 346/74.2

[56] References Cited

U.S. PATENT DOCUMENTS

| | | | |
|---|---|---|---|
| 3,493,694 | 2/1970 | Hunt | 179/100.2 |
| 3,860,965 | 1/1975 | Voegeli | 360/113 |
| 3,879,760 | 4/1975 | Lazzari | 360/113 |
| 3,921,217 | 11/1975 | Thompson | 360/113 |
| 3,921,218 | 11/1975 | Kayser | 365/158 |
| 4,071,868 | 1/1978 | Kaminaka et al. | 360/113 |
| 4,141,051 | 2/1979 | Kuisk | 360/113 |
| 4,150,408 | 4/1979 | Koel et al. | 360/113 |
| 4,277,808 | 7/1981 | Nagaki | 360/113 |
| 4,280,158 | 7/1981 | de Niet | 360/113 |

OTHER PUBLICATIONS

"Magnetoresistive Transducer with Canted Easy Axis", by F. J. Jeffers, Spin Physics, IEEE Trans. Mag., vol. MAG-15, Nov. 1979, pp. 1628-1630.

Primary Examiner—Robert M. Kilgore
Attorney, Agent, or Firm—Elizabeth E. Strnad; Robert G. Clay

[57] ABSTRACT

Two closely spaced magnetostatically coupled magnetoresistive elements are arranged with their respective planar surfaces in parallel. A nonmagnetic insulating material is interposed between the elements to prevent exchange coupling. Sense current flows simultaneously through both elements in the same direction and in perpendicular to the easy axis of magnetization. In response to signal fields applied in parallel with the sense current flow demagnetization components in the easy axis direction cancel. The output signal of the transducer is independent of recording track width and free of Barkhausen noise.

18 Claims, 10 Drawing Figures

U.S. Patent Oct. 26, 1982 Sheet 1 of 2 4,356,523
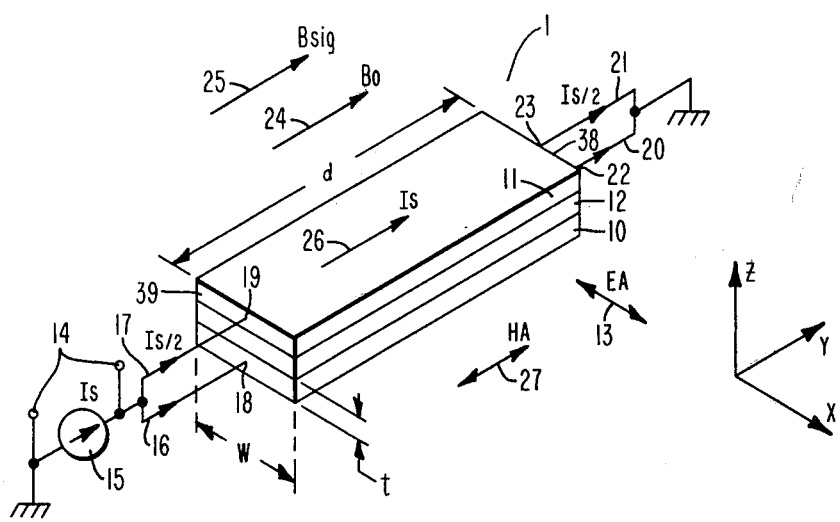
FIG_1
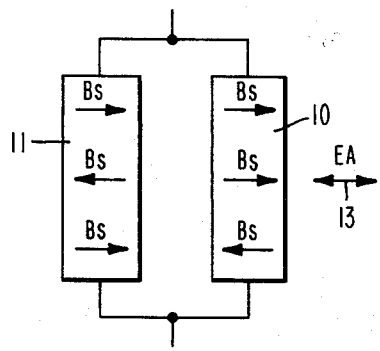
FIG_2A
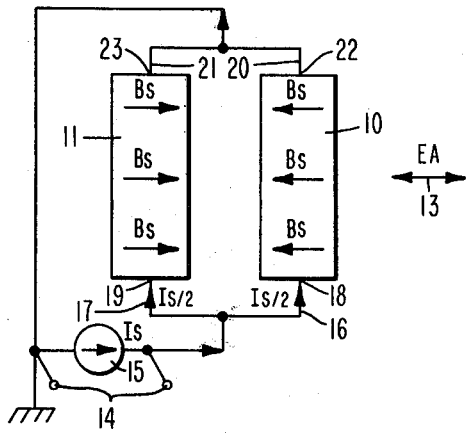
FIG_2B
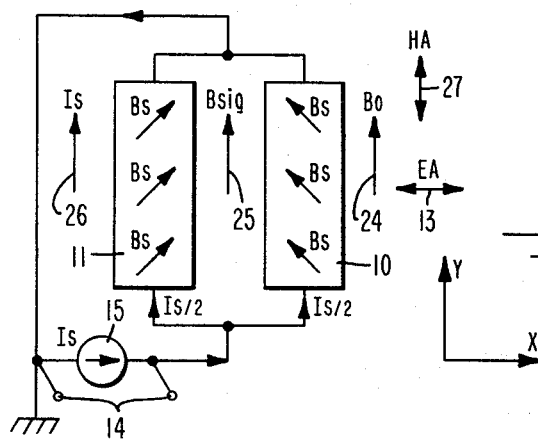
FIG_2C
FIG_2D   FIG_2E

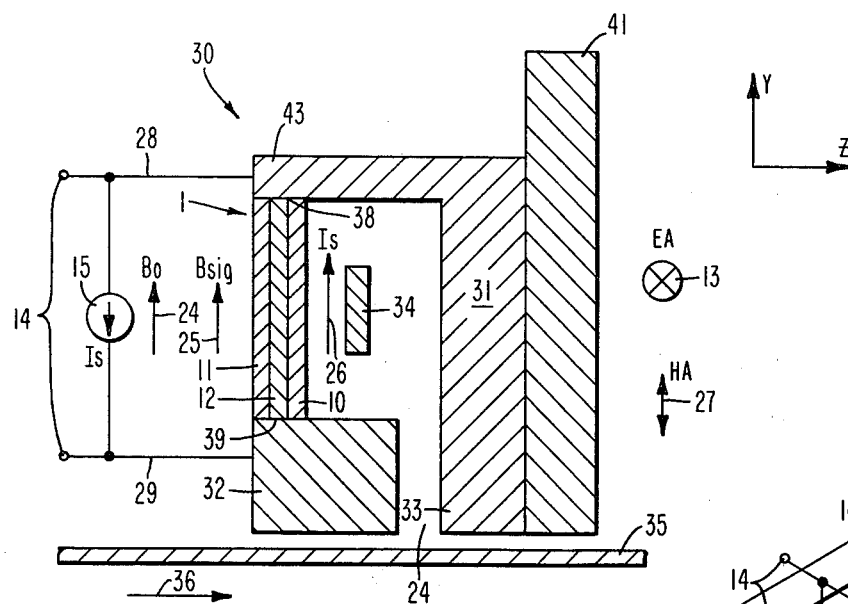

NARROW TRACK MAGNETORESISTIVE TRANSDUCER ASSEMBLY

BACKGROUND OF THE INVENTION

The invention relates to magnetoresistive transducers and more particularly, to a magnetoresistive transducer assembly suitable for reproduction of signals recorded on narrow tracks of an associated magnetic medium.

Magnetoresistive elements are known to exhibit change in resistivity in response to changes in an externally applied magnetic field. However, when utilized to detect signals recorded on very narrow tracks, for example, having a width in the order of 1 mil or less, they suffer from Barkhausen noise due to large demagnetization fields causing domain wall formation. The latter effects prevent utilization of these magnetoresistive elements in high density narrow track multichannel transducer applications.

Various transducers employing magnetoresistive elements are well known in the art. The commonly assigned U.S. Pat. No. 3,493,694 to Robert P. Hunt describes a reproduce head utilizing a narrow strip of magnetoresistive material which detects longitudinal or vertical field components of a recorded signal. In both cases the easy axis of magnetization of the strip is perpendicular to the magnetic field components to be detected and it is parallel with the direction of sense current flowing through the strip. In this prior art transducer the magnitude of output signal is proportional to the track width and consequently signal reproduction from narrow tracks becomes impractical.

Another known technique, such as described in U.S. Pat. No. 3,860,965 provides two magnetostatically coupled magnetoresistive layers having a sense current applied concurrently to both layers. Here the drive current serves as both the sense current and bias current. However, the relative directions of the easy axis of magnetization, sense current and magnetic signal field components, respectively correspond to the transducer of the previously mentioned Hunt patent, thus providing an output signal which is dependent on track width. Therefore, this prior art transducer is not suitable for signal reproduction from narrow recording tracks.

Further prior art techniques such as described in U.S. Pat. No. 4,071,868 employ a magnetoresistive element with sense current flowing in the direction of hard axis of magnetization. Here the output signal is not proportional to the track width but undesirable magnetic domain walls are formed in the element. To stabilize magnetic orientation, the element is made of a hard magnetic material. As well known, such material has low permeability and the resulting transducer efficiency is low.

Still further prior art devices, for example as described in U.S. Pat. No. 3,879,760, have two parallel magnetostatically coupled magnetoresistive strips having an easy axis inclined with respect to their length. The sense current flows through both strips in longitudinal direction. In absence of a signal field to be detected the magnetic orientations of the respective strips are in opposite directions along the inclined easy axis and the demagnetization components cancel. However, when a signal field is applied in perpendicular to sense current, the magnetic orientation in both elements changes to non-symmetrical and the demagnetization components in the easy axis direction do not cancel. Thus large signal field components may switch the magnetic orientation into the opposite direction. As it is well known such switching is accompanied by Barkhausen noise. The above-indicated features prevent these transducers from utilization in high density narrow track applications where high signal-to-noise ratio must be maintained. In addition, the resulting output signal in the above-indicated transducers is dependent on track width since the length of the strips extends in parallel therewith.

Other prior art magnetoresistive transducers are known to utilize permeable yokes surrounding the magneto-resistive element, to enhance transducer resolution and to protect the magnetoresistive element from wear. Examples of latter techniques are described in U.S. Pat. Nos. 3,921,217 and 4,150,408 respectively. Besides providing an output signal dependent on track width, these known devices have an additional disadvantage of necessary electric insulation between the magnetoresistive element and conductive yoke. The insulating material reduces transducer efficiency and contributes to manufacturing costs.

SUMMARY OF THE INVENTION

It is an object of the invention to provide a magnetoresistive transducer assembly suitable for signal reproduction from narrow recording tracks and providing both high resolution and high signal-to-noise ratio.

It is a further object of the invention to provide a narrow track magnetoresistive transducer assembly in which demagnetizing fields in the easy axis direction and Barkhausen noise are virtually eliminated.

It is a further object to provide a magnetoresistive transducer assembly having the above-indicated features while providing an output signal that a magnetoresistive transducer assembly suitable for signal reproduction from narrow recording tracks and providing both high resolution and high signal-to-noise ratio.

It is still a further object to provide a high density thin film multichannel magnetoresistive transducer structure having the above-indicated features and adapted for economical production.

It is another object of the invention to provide a transducer assembly having the above-indicated features and having a magnetoresistive element directly attached to a conductive magnetic yoke that is, without utilizing an intermediate insulating material therebetween.

In accordance with the invention a magnetoresistive transducer assembly is provided, having two magnetostatically coupled magnetoresistive elements of corresponding dimensions and similar magnetic and electric properties. The elements are arranged with their corresponding planar surfaces in parallel and in closely spaced relationship, while being separated from each other by a nonmagnetic electrically insulating material of a thickness sufficient to prevent exchange coupling between the elements. Each element has a D.C. sense current flowing therethrough in a direction substantially parallel with the magnetic signal field provided by a recorded signal to be detected and it has an easy axis of magnetization substantially perpendicular to the sense current flow. The respective directions of the easy axis and sense current flow define a plane parallel with the planar surfaces. The elements have a small thickness substantially normal to the planar surfaces.

BRIEF DESCRIPTION OF THE DRAWINGS

FIG. 1 is a perspective view of a magnetoresistive transducer in accordance with the preferred embodiment of the invention;

FIGS. 2A to 2E are diagrams showing magnetization vectors illustrating operation of the embodiment of FIG. 1;

FIG. 3 is a cross sectional schematic view of a further embodiment of the invention;

FIGS. 4 and 5 are perspective schematic views of respective multichannel magnetoresistive transducer embodiments of the invention; and FIG. 6 is a cross-sectional view of a thin film magnetoresistive transducer embodiment of the invention.

DESCRIPTION OF THE PREFERRED EMBODIMENTS

FIG. 1 shows a magnetoresistive transducer assembly 1 in accordance with the preferred embodiment of the invention. It has two matching closely spaced coextensive thin strips 10, 11 of magnetic metallic material separated from each other by a strip 12 of nonmagnetic electrically insulating material. The strips 10, 11 are preferably made of a material having low anisotrophy and high magnetoresistive coefficient, such as permalloy. The insulating material 12, for example $SiO_2$, has a thickness small enough to permit magnetostatic coupling between the strips 10, 11 while keeping these strips at a sufficient distance from each other to break up exchange coupling. The strips 10, 11 are matched to have substantially the same magnetic and electric properties and the insulating strip 12 is selected to have a coefficient of thermal expansion similar to that of magnetic strips 10, 11. Strips 10, 11, 12 are preferably of rectangular shape and matching dimensions including width w, depth d and thickness t respectively, as it is shown in FIG. 1.

Strips 10, 11 and 12 are preferably formed by well known thin film deposition techniques such as vacuum evaporation, sputtering, etc., on a suitable ceramic or glass substrate (not shown), as it is well known in the art. Two opposite end faces 38, 39 of transducer 1 are shown as being parallel with the recording surface of an associated medium (not shown), extending in the xz-plane and moving past one transducer end face 38 or 39 in the z-axis direction with respect to an orthogonal coordinate system x, y, z shown in FIG. 1 to facilitate description. In accordance with the invention the magnetic strips 10, 11 are both provided with an easy axis of magnetization EA shown by arrow 13 which in FIG. 1 is in parallel with axis x. A D.C. sense current Is is provided by current source 15 flows via leads 16, 17 through both magnetoresistive elements 10, 11 simultaneously in the y-axis direction as shown by arrow 26, that is, in parallel with the hard axis of magnetization HA shown by arrow 27. The sense current Is from the elements 10, 11 returns via conductors 20, 21 and ground to the current source 15.

In accordance with the well known theory of magnetoresistivity, the thickness t of each element 10, 11 is relatively small when comparing to their its other dimensions d, w, respectively. In the embodiment of FIG. 1 the thickness t may be selected between 100Å and 2000Å, while d is 0.5 to 5 mils and w≦1 mil.

D.C. bias field Bo shown by arrow 24 extends in parallel with the sense current flow 26 through the elements 10, 11. The bias field 24 is applied substantially symmetrically with respect to the elements 10, 11 by means of a permanent magnet or electromagnet (not shown) as it is well known in the art and will be described later in more detail.

When a variable external magnetic signal field Bsig shown by arrow 25, is applied to the above-described embodiment of FIG. 1 in parallel with the previously described directions of the sense current flow 26 and bias field 24 respectively, a corresponding change in magnetization of the elements takes place. The latter change may be detected as a change in resistivity, as it is well known in the art, for example by measuring the output voltage across the elements 10, 11, for example at terminals 14 by a high impedance voltmeter (not shown) as well known in the art.

Changes in magnetization due to external fields are known to effect demagnetization components leading to formation of undesirable domain walls and resulting Barkhausen noise in prior art magnetoresistive transducers. The transducer of FIG. 1 eliminates the above-indicated disadvantages by cancelling the demagnetization components in the easy axis direction and consequently maintaining the magnetization in both magnetoresistive elements in the single domain, independently of the magnitude of the bias field as well as of the applied signal field. At the same time, the output signal is derived from the useful magnetization components in the hard axis direction. The resulting output signal is free of Barkhausen noise and also, its magnitude is independent of the recorded signal track width, as it will be described in more detail below.

FIGS. 2a to 2e are diagrams helpful in describing the operation of the transducer of FIG. 1. They show respective magnetization vectors Bs in magnetoresistive elements 10, 11 in response to magnetic fields applied to these elements, as it will be described below. It is noted that throughout the specification and drawings corresponding elements are designated by corresponding reference numerals to facilitate comparison. For better clarity of representation, in FIGS. 2a to 2c the magnetoresistive elements 10 and 11 are shown side by side. It will be understood that the respective orientations of vectors Bs as shown in each element are actually obtained when these magnetostatically coupled elements 10, 11 are superimposed as shown in FIG. 1.

FIG. 2a shows the thin magnetoresistive elements 10, 11 of FIG. 1 prior to application of sense current Is. It is seen that the magnetization vectors Bs have parallel as well as antiparallel orientations with respect to the easy axis of magnetization 13. In FIG. 2b the sense current is applied from D.C. current source 15 via leads 16, 17 to the electrically connected ends 18, 19 of elements 10, 11. Sense current of a magnitude Is/2 flows longitudinally in the same direction simultaneously through both elements 10, 11, and it is returned from the opposite electrically connected ends 22, 23 of elements 10, 11, via leads 20, 21 and ground to source 15. It follows from the identical direction and magnitude of sense current flow through each symmetrically arranged element 10, 11 in accordance with the invention that symmetrical magnetic fields are induced in the respective elements 10, 11. Consequently, one of the elements, for example 11, is magnetized along the easy axis 13 in positive direction while the other element for example 10, in the negative direction as shown in FIG. 2b. To start the operation, it is preferred to apply the sense current Is in the form of a pulse of sufficient magnitude and duration necessary for switching the magnetization into the above-described initial state as shown in FIG. 2b. FIG. 2c shows a change in the direction of magnetization in both layers 10, 11, respectively, in response to a signal field Bsig indicated by arrow 25 applied in parallel with the direction 26 of the sense current flow through the elements 10, 11. Because of the symmetrical arrangement of layers 10, 11 with respect to the particular respective directions of the easy axis 13, sense current 26 and signal field component 25 as described above, the respective orientations of the magnetization vectors Bs change symmetrically in both elements 10, 11 in response to a changing signal field Bsig.

Thus, magnetization vectors Bs of elements 10, 11 have symmetrically changing both x and y-axis components, respectively. For simplification, the bias signal field Bo has not been considered in the above description. It will be understood that the foregoing description applies also when a D.C. bias field Bo as shown by arrow 24 is applied to the elements 10, 11 of FIG. 2c in parallel with the signal field Bsig that is, in the direction of y-axis. Such a bias field Bo is necessary if a linear response over a desired output signal range has to be obtained as it is well known in the art. However, to maintain the symmetrical properties of the elements 10, 11, a uniform bias field Bo should be applied thereto. Preferably, the magnitude of the bias field Bo is selected such that the resulting angle $\theta$ between the magnetization vector Bs and sense current flow Is is approximately 45° for best linearity of the response, as well known.

FIG. 2d shows the magnetization vector Bs of element 11 and FIG. 2e of element 10, corresponding to FIG. 2c. respectively, decomposed into respective x and y-axis components Bsx, Bsy. In accordance with the foregoing description, each y-axis component Bsy corresponds to the sum of the previously mentioned bias field component Bo and signal field component Bsig that is, Bsy=Bo+Bsig. It follows from the above description with reference to FIGS. 1 and 2c that the angle $\theta$ between vectors Bs and Bsy is the same as the angle between the magnetization vector Bs and sense current Is. It is seen from FIGS. 2d and 2e that while the y-axis components of both elements 10 and 11 have the same orientation, the x-axis components are oppositely oriented. Since the closely spaced superimposed elements 10, 11 are magnetostatically coupled with eachother the Bsx components cancel. Consequently, the output signal is derived from the Bsy components, as it will be described later. It follows from the foregoing description that if an external magnetic field, such as a signal field from magnetic tape, disk etc., is applied to the magnetoresistive transducer assembly of the invention in a direction substantially parallel with the sense current flow through the elements in the hard axis direction, then an output signal proportional to the external field variations is obtained. At the same time the demagnetization components of the elements in the easy axis direction cancel and the resulting output signal is free of Barkhausen noise.

It is noted with respect to the symmetrical arrangement of the magnetoresistive elements that the above description applies also if the polarity of the sense current Is and/or of the bias field Bo is reversed, respectively, with respect to the polarities shown in FIG. 1. For example, when the orientation of the sense current Is is opposite to that shown in FIGS. 1 to 2c, while the orientation of Bo remains the same, the respective magnetization vectors Bs will be oppositely oriented and their x-axis components cancelled, as described before.

The following analysis is related to the above described magnetoresistive transducer assembly of FIG. 1. It demonstrates that the output signal of the transducer of the invention is independent of the recorded signal track width. For purpose of the analysis it is assumed that demagnetizing fields in the symmetrically arranged elements 10, 11, are cancelled as it has been disclosed above. Consequently, the analysis is made for only one element 10 or 11 shown in FIG. 1, having a depth d, thickness t and width w, as previously described. It is assumed that the width w of the element corresponds to the recorded signal track width.

Let's assume in accordance with FIG. 1 that the respective directions of the sense current Is, bias field Bo and signal field Bsig are parallel with the y-axis, that the easy axis of magnetization EA extends in parallel with x-axis while the thickness of the element is in parallel with z-axis. Then the sense current flowing through that element is:

$$\frac{Is}{2} = \tau w t \quad (1)$$

where
Is is the D.C. sense current;
$\tau$ is the current density through the element;
w is the width of the element; and
t is the thickness of the element.

The resistance of the element at absence of any magnetic field may be expressed as $$R_o = \rho o \frac{d}{wt} \quad (2)$$

where $\rho o$ is the specific resistivity of the material; and
d is the depth of the element.

The magnetoresistance of the element may be expressed as $$\Delta R = \Delta \rho \frac{d}{wt} \quad (3)$$

where $\Delta R$ is the change in resistance of the element due to external magnetic field; and
$\Delta \rho$ is the magnetoresistivity As it is well known from the theory of magnetoresistivity, the resistance of a magnetoresistive element is $$R = R_o + \Delta R \cos^2 \theta \quad (4)$$

where R is the magnetoresistance of the element;
and $\theta$ is the angle between the magnetization vector Bs and direction of sense current Is (also shown in FIGS. 2d and 2e).

From the respective diagrams of FIGS. 2d and 2e follows that $$\cos \theta = \frac{Bsy}{Bs} = \frac{Bo + Bsig}{Bs} \quad (5)$$

where
Bs is the saturation magnetization of the element;
Bsy is the y-axis component of Bs;
Bo is the magnitude of the bias field;
Bsig is the magnitude of the signal field.

After substituting equation (5) into equation (4) we obtain:

$$R = R_o + \Delta R \left( \frac{Bo^2}{Bs^2} + \frac{2\,Bo\,Bsig}{Bs^2} + \frac{Bsig^2}{Bs^2} \right) \quad (6)$$

Since $$R_o + \Delta R \frac{Bo^2}{Bs^2} = const \quad (7)$$

$$\frac{Bsig^2}{Bs^2} << \frac{2\,Bo\,Bsig}{Bs^2} \quad (8)$$

equation (6) could be simplified as $$R \approx \Delta R \frac{2\,Bo\,Bsig}{Bs^2} + const \quad (9)$$

Then the output signal voltage from the element obtained by combining equations (1), (3) and (9) is $$V_{sig} = \tau wt \cdot \frac{\Delta\rho \cdot d}{wt} \cdot \frac{2\,Bo\,Bsig}{Bs^2} \quad (10)$$

and after simplification $$V_{sig} = \frac{\tau \Delta \rho d\, 2\,Bo\,Bsig}{Bs^2} \quad (11)$$

The above-indicated output signal corresponds to output voltage from one magnetoresistive element in accordance with FIG. 1 having sense current Is/2 flowing therethrough or from both symmetrically arranged elements connectd in parallel, with sense current of magnitude I, as previously described.

The foregoing analysis with reference to equation (11) reveals that the output signal from the transducer of the invention is proportional to the depth d of the magnetoresistive elements, and to the magnitude of both the bias field Bo and signal field Bsig, respectively, while being independent of the track width w of the recorded signal.

Thus, if the magnetoresistive transducer of the invention is formed to have a small width for example 1 mil or less, it may be utilized for reproduction of magnetic signals recorded on corresponding high density narrow tracks of an associated medium, such as tape, disk, etc., while the reproduced signal is not impaired by the narrow track width.

An experimental thin film transducer embodiment in accordance with FIG. 1 has been made having the following dimensions: width w=1 mil; depth d=50 mil; thickness of each magnetoresistive layer t=2 microinches; and thickness of the intermediate insulating layer 6 microinches. A D.C. sense current Is=20 mA and D.C. bias field Bo=3 Oe were applied, respectively. The total resistance of the double layer transducer was approximately 100 Ohm. The Barkhausen noise measured at a maximum output signal level of about 20 mV and at frequency spectrum 0 to 1000 Hz, was below the background noise of the spectrum analyser utilized, that is, below 10 microvolts/$\sqrt{Hz}$.

A further embodiment of the invention schematically shown in FIG. 3 utilizes the magnetoresistive transducer of FIG. 1 in combination with a magnetically permeable yoke to concentrate flux and reduce wear, as it is known in the art. However, it will be appreciated that such combination in accordance with the invention yields additional advantages as it will follow from the description below.

A magnetoresistive transducer assembly 30, shown in cross section, comprises a nonmagnetic nonconductive substrate 41 for example of $SiO_2$, to which a magnetic yoke 31 is attached. A portion of the yoke 31 is interrupted and bridged by a magnetoresistive transducer 1 such as previously described and shown in FIG. 1. To facilitate comparison, similar elements in FIGS. 1 and 3 are designated by similar reference numerals and their description will not be repeated.

In the drawings various dimensions, such as thickness of the respective elements, are not shown in proportion with respect to other dimensions for better clarity of representation. The yoke 31 is made of electrically conducting permeable material, such as permalloy. The interrupted portions 32, 43 of yoke 31 are in direct contact with opposite end portions 39, 38 of the magnetoresistive transducer 1 and they serve as conductors for sense current flow into and from transducer 1. Consequently, no insulation is provided between the end portions 39, 39 of elements 10, 11 and the portions 43, 32 of yoke 31, respectively. External thin film conductors 28, 29 may connect sense current source 15 with the portions 43, 32 of the yoke 31.

A substantially uniform bias field Bo is provided by a bias conductor 34, arranged in parallel with the magnetoresistive elements 10 and 11. The conductor 34 is connected to a suitable D.C. bias current source (not shown) as it is well known in the art. The bias field Bo, as shown by arrow 24, is provided in parallel with the sense current flow 26 as previously disclosed with reference to FIG. 1.

Alternatively, two parallel bias conductors may extend each on the opposite side of transducer 1 for better symmetricity of the bias field provided with respect to the elements 10, 11.

A magnetic recording medium, for example, tape 35 carrying a prerecorded information signal is shown in FIG. 3 as moving past the transducer assembly 30 in the xz plane, in the direction of arrow 36. The width w of the transducer 1 corresponds substantially to the recorded track width which extends in parallel with axis x, that is, perpendicularly to the plane of the drawing. Confronting planar surfaces of portions 32, 33 of the yoke 31 which are close to the surface of tape 35 form a transducing gap 24, as well known in the art. These portions 32, 33 serve as flux guides picking up and concentrating signal flux emerging from the tape at the gap 24 and they carry the concentrated flux corresponding to Bsig through the magnetoresistive elements 10, 11 in the direction of y-axis as shown by arrow 25. The parameters such as length, depth, etc., of gap 24 may be selected with respect to the particular application and characteristics of signal flux to be reproduced, as well known in the art. It follows from the above description of the embodiment of FIG. 3 that the relative directions of the sense current Is, bias field Bo and signal field Bsig, respectively extend in the hard axis direction 27 of elements 10, 11 as previously described with reference to FIG. 1. Thus the embodiment of FIG. 3 has the previously described advantages of the embodiment of FIG. 1, namely an output signal independent of track width and free of Barkhausen noise. Since the concentrated signal supplied via the flux guides 32, 33 passes through the magnetoresistive elements directly, that is without having to penetrate through intermediate insulating layers, the head efficiency of the embodiment of FIG. 3 is enhanced.

Instead of utilizing a bias conductor such as 34 in FIG. 3, the bias current may be supplied by conductive strips (not shown) superposed with the respective magnetoresistive layers 10, 11. In the latter case additional insulating layers have to be provided to separate the electrically conductive elements 10, 11 from the bias conductor strips, as it will be described later.

In some applications, where desirable, it is possible to apply A.C. bias signal to the magnetoresistive transducer of the invention instead of the above-described D.C. bias signal. It may be supplied by a suitable A.C. current source as known in the art. In applications where nonlinearity of the transducer response is not of concern utilization of a magnetic bias field may be deleted from the magnetoresistive transducer of the invention.

The embodiment of FIG. 3 may be manufactured by well known thin film deposition techniques while narrow track multichannel magnetoresistive transducers having a desirable high resolution may be built conveniently by simultaneously depositing on a suitable substrate a plurality of layers forming a plurality of transducer channels, as it will follow from further description.

FIG. 4 schematically shows a multichannel magnetoresistive transducer 40 which comprises a plurality of parallel channels 30 attached to a common nonmagnetic substrate 41 of which three channels are shown. The structure of each channel is similar to the previously described transducer assembly of FIG. 3. To facilitate comparison, similar elements of both FIGS. 3 and 4 are designated by similar reference numerals. The substrate 41 is preferably made of a suitable nonmagnetic material, for example, ceramic, glass, silicon wafer, etc.. In the embodiment of FIG. 4 each channel has an individual sense current circuit comprising a D.C. current source 15 connected in a manner previously described with reference to FIG. 3. A suitable source 42 of D.C. bias current Io is connected to conductor 34, which conductor is common to a plurality of channels 30 and supplies to the respective magnetoresistive elements 10, 11 pertaining to the individual channls a uniform magnetic bias field Bo in the y-axis direction as previously described.

In the multichannel transducer of FIG. 4 the output signal of each channel is detected for example, by a suitable voltmeter (not shown) at the respective output terminals 14, connected via the interrupted yoke portions 43, 32 to the opposite end portions 38, 39 of the magnetoresistive transducer elements 10, 11, as shown in FIG. 4.

It follows from the foregoing description that the embodiment of FIG. 4 yields a high resolution multichannel transducer having magnetoresistive elements closely packed in narrow transducing channels.

A still further embodiment of a narrow track multichannel transducer assembly 51 of the invention is schematically shown in FIG. 5 and will be described briefly. To a nonmagnetic substrate 41 a plurality of spaced permeable conductive yokes 45 is attached, pertaining to a plurality of parallel channels 46. Each yoke 45 comprises three confronting portions 47, 48, 49 extending adjacent to the surface of a recording medium, for example tape 35. These portions 47, 48, 49 define respective transducing gaps 61, 62 and they serve as flux guides carrying flux emerging from the tape to the magnetoresistive transducer 1, corresponding to the transducer of FIG. 1. The middle portion 48 of yoke 45 is interrupted and bridged by the magnetoresistive transducer 1. Sense current terminals 52, 53 are provided at both ends of the interrupted yoke portion 48 and connected to sense current source 15. Yoke portion 48 connected to sense current terminal 53 may be common to a plurality of parallel channels 46, while oppositely arranged terminals 52 are provided individually for each channel. The latter arrangement allows closer channel-to-channel arrangement by eliminating need for additional outlets in close proximity to recording surface. By comparing the embodiments of FIGS. 4 and 5 it is seen that the transducer assembly of FIG. 5 is similar to that of FIG. 4 while the following differences are apparent. The transducer of FIG. 5 has three flux guides 47, 48, 49 adjacent to the tape surface 35 and two transducing gaps 61, 62. Consequently, a differential signal flux flows through the magnetoresistive elements 10, 11 obtained as a difference between the fluxes picked up by the respective gaps 61, 62, as it is well known in the art. For comparison, in the embodiment of FIG. 4 the total amount of flux picked up by the transducing gap 24 passes through the element 1. However, in both embodiments of FIGS. 4 and 5 the output signal of each respective channel of the multichannel of the multichannel transducer is proportional to the magnetic signal flux from a narrow recording track associated with that channel, while the output signal is independent of the narrow track width and free of Barkhausen noise.

Instead of one conductor 34 of FIG. 4, the two conductors 63, 64 connected in parallel and arranged on the opposite sides of the magnetoresistive elements 10, 11 of FIG. 5 provide a bias field of improved uniformity with respect to elements 10, 11.

It will be appreciated that in both embodiments of FIGS. 4 and 5 the opposite end faces 38, 39 of the magnetoresistive transducer elements 10, 11 are in direct electric contact with the permeable conductive yoke, without utilizing intermittent electrically insulating layers. The resulting transducer efficiency is thus improved. It will be understood that the previously mentioned advantages of the various transducer embodiments of the invention shown in FIGS. 1, 3 and 4, respectively, over the prior art transducers also apply to the transducer of FIG. 5.

The various previously described embodiments of the invention may be constructed by well known thin film deposition techniques as it will follow from further description with reference to FIG. 6. FIG. 6 shows cross section of a thin film magnetoresistive transducer assembly 70 whose magnetic and electric circuits substantially correspond to previously described transducer assembly 51 of FIG. 5. The transducer assembly 70 may be provided either as a single channel or multichannel transducer and is especially suitable for use in signal reproduction from narrow recording tracks, such as having a width of 1 mil or less. It will be appreciated that a high density multichannel narrow track transducer assembly in accordance with the invention may be readily and conveniently manufactured by a method which will be described as an example below.

FIG. 6 shows a magnetic ferrite substrate 71, obtained for example by slicing from bulk ferrite material (not shown) and subsequently grinding and lapping to obtain a planar surface 72 as well known in the art. Thereafter, the ferrite substrate 71 is machine-grooved by a suitable tool for example to a depth 1 micron to 20 microns and the obtained groove 73 is subsequently filled, for example by plating, with a suitable conductive material such as copper to provide a bias conductor layer 74. Thereafter, the planar surface 72 is lapped and polished to obtain a maximally flat smooth surface in preparation for subsequent material deposition. Then the surface 72 with the exception of a portion 75 is masked by suitable overlapping mask, such as photoresist (not shown) and a layer 75 of an electrically insulating nonmagnetic material such as $SiO_2$ is sputtered on the unmasked surface to insulate the conductive layer 74 from subsequent layers as well as to form a first nonmagnetic transducing gap 76. The thickness of layer 75 corresponds to the desired length of gap 76. After removing the mask in a well known manner, a first magnetoresistive layer 10 of a magnetic conductive material, such as NiFe of a thickness 100 Å to 2000 Å is evaporated or sputtered on top of the above-described surface 72 and layer 75. Then the surface areas with the exception of a portion 12 are masked, for example by photoresist, and a nonmagnetic electrically insulating layer 12, for example $SiO_2$ is sputtered thereon. The mask is removed and a second magnetoresistive layer 11 of the same material having the same thickness as layer 10 is deposited in the same manner. It is noted that the respective layers 10, 11 of the embodiment of FIG. 6 correspond to the magnetoresistive elements previously described with reference to FIGS. 1 to 5, respectively. Therefore, during deposition of layers 10, 11 a D.C. magnetic field of a magnitude 3 Oe to 100 Oe is applied thereto in a direction 80 substantially parallel with the plane of these respective layers, as shown in FIG. 6. Application of the latter field effects a desired orientation of the easy axis EA of magnetization of layers 10, 11 in parallel with that applied field. The above-indicated easy axis orientation of layers 10, 11 is necessary for proper operation of the magnetoresistive transducer of the invention, as it has been described previously with reference to the embodiment of FIG. 1.

As a next step, a suitable mask such as photoresist is deposited on the previously deposited layer 11, with the exception of the areas designated 78, 79 followed by deposition of a layer of magnetic conductive material onto these unmasked areas. Respective preferred thicknesses of these and following layers will be given below. Thereafter a suitable conducting material 81, such as copper, is deposited in a known manner at the back portion, connecting the respective layers 11 and 79. The layer 81 forms a sense current terminal, to which lead 83 is attached. The other sense current terminal (not shown) is deposited simultaneously in contact with layer 11 at the transducer front portion 88. In case of a multichannel transducer the latter terminal may be formed as being common to a plurality of channels to effect considerable reduction in channel-to-channel spacing. Sense current lead 84 is attached to the latter terminal. To leads 83, 84 a suitable sense current source (not shown) is coupled as previously mentioned with respect to the embodiments of FIGS. 1 to 5. Then the rest of photoresist is removed and a new photoresist mask (not shown) is deposited substantially covering an area corresponding to the superposed layers 10, 11, 12. The latter mask has dimensions corresponding to a desired depth d and width w, respectively, of the magnetoresistive transducer 1 as previously disclosed with reference to FIG. 1. To precisely define the desired shape and edges of transducer 1, the unmasked portions are etched in the direction of x-axis and along the edges parallel with y-axis for example by plasma etching or ion milling, as well known in the art, to remove all the respective materials extending above the insulating layer 75. Thereafter the mask is removed from a portion designated 85 and a further nonmagnetic insulating layer, such as $SiO_2$ is sputtered thereon, forming a second transducing gap 86 having a desired length. A second bias conductor layer 87, such as copper, is deposited, for example by plating on top of the insulating layer 85, at a distance from the front end 88 facing a recording medium 35. At the back portion opposite the front end 88, the latter conducting layer 87 is made shorter than insulating layer 85 to avoid contact with adjacent layer 79. A further nonmagnetic insulating layer 88 for example of $SiO_2$ is sputtered to cover and overlap the layer 87 to separate it from subsequently deposited magnetic conducting layer 90. Layer 90 is perferably made of NiFe and extends over the previously deposited layers with exception of 81. It will be understood that insulating layer 88 does not need to separate any portion of the respective magnetic conductive layers 79, 90; alternatively, the latter layers 79, 90 may be deposited as one continuous layer.

The combined thickness of layers 74 and 75, as well as the combined thickness of layers 85, 87 and 88 is preferably 1 micron to 25 microns. The thickness of layer 78 is preferably 0.1 micron to 2 microns and the thickness of layer 90 is preferably 0.5 micron to 10 microns. The thickness of layer 79 is 1000 A to 1 micron.

As it is seen from FIG. 6, the respective magnetic conductive layers 71, back portions of layers 10, 11 layers 79 and 90, respectively, are in direct contact with each-other, thus forming a magnetic yoke corresponding to yoke 45 of FIG. 5. Front portions of layers 10, 11 and layer 78 in direct contact therewith form an interrupted portion of the yoke, bridged by the magnetoresistive element 1. After the respective layers of material necessary to form the thin film transducer of FIG. 6 have been deposited as above described, the transducer is lapped at its front end 88 to obtain a desired gap depth as it is well known in the art.

It will become apparent that nonmagnetic conductive layers 74, 87 of FIG. 6 correspond to bias conductors 63, 64 of FIG. 5; conductive layer 81, and another corresponding one (not shown) of FIG. 6 correspond to sense current terminals 52, 53 of the embodiment of FIG. 5; transducing gaps 76, 86 of FIG. 6 correspond to gaps 61, 62 of FIG. 5.

It will be apparent to those skilled in the art that the above described thin film head and manufacturing method, respectively, are applicable to both single channel and multichannel transducers in accordance with the present invention. It will be understood however, that in multichannel applications masks with multichannel patterns will be utilized during the respective material deposition to assure channel-to-channel separation.

Instead of utilizing a magnetic substrate, such as 71 in FIG. 6, a nonmagnetic nonconductive substrate may be utilized, such as of $SiO_2$. A magnetic conductive layer such as NiFe may be then deposited thereon to provide a portion of the magnetic yoke corresponding to layer 71 of FIG. 6. The remaining layers forming the transducer of FIG. 6 may be then subsequently deposited in a manner similar to that previously described, utilizing well known deposition techniques.

It is understood that in the latter case an addititional layer of nonmagnetic electrically insulating material (not shown) will have to be deposited to separate the respective electrically conductive layers 71, 74 from each-other.

It will become apparent from the foregoing disclosure that single channel or multichannel transducer assemblies in accordance with the invention may be utilized for a large variety of analog or digital recording applications, such as utilized in audio, video, instrumentation, etc., signal reproduction from magnetic tape, disk or other suitable media.

Although the invention has been described in conjunction with preferred embodiments, it will be appreciated that modifications and changes may be made without departing from the spirit and scope of the invention as defined by the appended claims.

I claim:

1. A magnetoresistive transducer assembly suitable for detecting signals recorded on narrow tracks of an associated medium, comprising in combination:
   two magnetostatically coupled magnetoresistive elements having corresponding dimensions and similar magnetic and electric properties, each element having a thickness significantly smaller with respect to its other dimensions, said elements having corresponding planar surfaces arranged in closely spaced parallel relationship;
   a nonmagnetic nonconductive material interposed between said corresponding planar surfaces to separate said elements from each other and to prevent exchange coupling therebetween;
   said recorded signals providing a magnetic signal field applied to said magnetoresistive elements in a first direction;
   each magnetoresistive element having an easy axis of magnetization in a second direction substantially perpendicular to said first direction, said first and second direction defining a plane substantially parallel with said corresponding planar surfaces; and
   a first means coupled to apply a D.C. sense current flow in the same direction through both said elements and substantially in parallel with the first direction.

2. The magnetoresistive transducer assembly of claim 1 wherein said magnetoresistive elements are formed by two substantially identical coextensive strips of magnetic conductive material having a depth substantially parallel with said first direction, a width substantially parallel with said second direction and a small thickness relative to both said depth and width, respectively, and extending substantially perpendicularly thereto.

3. The magnetoresistive transducer assembly of claim 1 or 2 further comprising a second means coupled to provide a substantially uniform magnetic bias field in a direction substantially parallel with said first direction.

4. The magnetoresistive transducer assembly of claim 3 wherein said second means is coupled to provide a D.C. magnetic bias field.

5. The magnetoresistive transducer of claim 2 wherein said strips are interconnected at respective opposite end faces to provide respective input and output terminals for the sense current flow through said elements.

6. The magnetoresistive transducer assembly of claim 2 wherein the width of said strips substantially corresponds to recording track width of said associated medium.

7. The magnetoresistive transducer assembly of claim 1 or 6 wherein said width is 1 mil or less.

8. The magnetoresistive transducer assembly of claim 1 or 2 wherein said magnetoresistive elements are coextensive layers of magnetic conductive material deposited on a nonmagnetic nonconductive substrate, and wherein said nonmagnetic nonconductive material is deposited as an intermediate layer separating said magnetoresistive layers from each other.

9. The magnetoresistive transducer assembly of claim 1 or 2 wherein a plurality of similar spaced parallel transducers is formed on a common substrate, each forming one transducing channel of a high density narrow track multichannel magnetoresistive transducer structure.

10. The magnetoresistive transducer assembly of claim 1 further comprising:
    a yoke of magnetic conductive material, having at least two confronting pole pieces defining at least one transducing gap therebetween, said yoke having confronting interrupted portions;
    said magnetoresistive elements bridging said interrupted portions and having opposite end faces in direct contact with said confronting interrupted portions; and
    said interrupted portions of said magnetic yoke being coupled to said means for applying said D.C. sense current flow through said elements.

11. A magnetoresistive transducer assembly suitable for detecting signals recorded on narrow tracks of an associated medium, said recorded signals providing a magnetic signal field, comprising in combination:
    two substantially identical magnetostatically coupled magnetoresistive strips of magnetic conductive material, said strips being coextensive and superposed with their corresponding planar surfaces in parallel relationship,
    said magnetic signal field being applied to both said magnetoresistive strips in a first direction;
    each strip having a depth extending substantially in parallel with said first direction, an easy axis of magnetization extending in a second direction substantially perpendicular to said first direction, a width substantially in parallel with said second direction and a thickness significantly smaller with respect to both said depth and width, respectively;
    a nonmagnetic nonconductive material interposed between said parallel planar surfaces of said strips to separate them from each other and to prevent exchange coupling therebetween;
    a means coupled to apply a D.C. sense current flow through both strips simultaneously in the same direction and substantially in parallel with said first direction; and
    means coupled to provide a substantially uniform D.C. magnetic bias field in a direction substantially parallel with said first direction.

12. A multichannel magnetoresistive transducer assembly suitable for reproduction of signals recorded on high density narrow tracks of an associated medium, said recorded signals providing a magnetic signal field, comprising in combination:
    substrate means for supporting a plurality of spaced parallel transducing channels, each channel comprising in combination:

two matched magnetostatically coupled magnetoresistive elements having corresponding dimensions and similar magnetic and electric properties, said elements having corresponding planar surfaces arranged in closely spaced parallel relationship;

said magnetic signal field being applied to both said magentoresistive elements in a first direction;

each magnetoresistive element having an easy axis of magnetization in a second direction substantially perpendicular to said first direction, said first and second direction defining a plane substantially parallel with said corresponding planar surfaces;

each magnetoresistive element having a thickness significantly smaller with respect to its other dimensions;

a nonmagnetic nonconductive material interposed between said corresponding planar surfaces to separate said elements from each other and to prevent exchange coupling therebetween;

means coupled to apply D.C. sense current flow through both said elements simultaneously in the same direction and substantially in parallel with the first direction;

a yoke of magnetic conductive material, having at least two confronting pole pieces defining at least one transducing gap therebetween, said yoke having confronting interrupted portions;

said magnetoresistive elements bridging said interrupted portions and having opposite end faces in direct contact with said confronting interrupted portions;

said interrupted portions of said magnetic yoke being coupled to said means for applying said D.C. sense current flow through said elements;

said multichannel magnetoresistive transducer assembly further comprising a bias conductor common to said plurality of transducing channels and arranged in parallel with said magnetoresistive elements; and a D.C. bias current source coupled to said bias conductor for providing a substantially uniform bias field substantially in a parallel with said first direction.

13. A thin film magnetoresistive transducer assembly having at least one channel suitable for detecting signals recorded on narrow tracks of an associated medium, said recorded signals providing a magnetic signal field, said transducer comprising in combination:

a first nonconductive magnetic material having a planar surface defining a front end and a back portion opposite to said front end, said first magnetic nonconductive material having a groove extending inwardly of said planar surface and at a distance from both said front end and back portion, respectively;

a first layer of nonmagnetic conductive material filling said groove;

two substantially identical superposed coextensive magnetoresistive layers of magnetic conductive material having a predetermined thickness and extending from said front end to said back portion, said magnetic signal field being applied to both said magnetoresistive layers in a first direction substantially parallel with said planar surface, said magnetoresistive layers having an easy axis of magnetization in a second direction which is substantially perpendicular to said first direction, said first and second direction defining a plane substantially parallel with said planar surface, said magnetoresistive layers being in contact at both said front end and back portion, and being separated from each other over a predetermined middle portion, respectively:

a second layer of magnetic conductive material extending over said contacting magnetoresistive layers at said front end;

a first insulating layer of nonmagnetic nonconductive material interposed between said coextensive magnetoresistive layers to separate said predetermined middle portions thereof, said first insulating layer having a thickness selected to prevent exchange coupling while allowing magnetostatic coupling between said magnetoresistive layers, respectively, said first insulating layer having a predetermined depth and width, respectively;

a second layer of nonmagnetic conductive material extending substantially coextensive with said first layer of nonmagnetic conductive material;

a second insulating layer of nonmagnetic nonconductive material interposed between said first layer of nonmagnetic conductive material and said first magnetic material on one side and one said magnetoresistive layer on the other side, to separate said respective layers from each-other and to define a first transducing gap;

a third insulating layer of nonmagnetic nonconductive material interposed between said second layer of nonmagnetic conductive material on one side and the other one of said magnetoresistive layers and said second layer of magnetic conductive material on the other side to separate said respective layers from each-other;

a third layer of magnetic conductive material extending from said front end to said back portion, said third magnetic conductive layer being in contact with said magnetoresistive layers at said back portion;

a fourth insulating layer of nonmagnetic nonconductive material interposed between said second layer of nonmagnetic conductive material and said third layer of magnetic conductive material to separate them from each-other, said fourth insulating layer being connected to said third insulating layer at said front end to separate said second and third layers of magnetic conductive material from each-other and to form a second transducing gap therebetween.

14. The thin film magnetoresistive transducer assembly of claim 13 further comprising:

a third nonmagnetic conductive layer in contact with one said magnetoresistive layer and said third magnetic conductive layer at said back portion and a fourth nonmagnetic conductive layer in contact with one said magnetoresistive layer and said second magnetic conductive layer at said front end; and a means for providing a sense current coupled to said third and fourth nonmagnetic conductive layers, respectively.

15. The thin film magnetoresistive transducer assembly of claim 14 wherein a plurality of similar spaced parallel thin film transducers is formed on a common substrate, each transducer corresponding to one transducing channel of a high density multichannel magnetoresistive transducer assembly, each channel having a track width in the order of one mil or less, and wherein said first, second and fourth nonmagnetic conductive layer, respectively, is common to said plurality of transducing channels.

16. The thin film magnetoresistive transducer assembly of claim 13 wherein a means for providing a D.C. bias current is coupled to said first and second nonmagnetic conductive layers, respectively.

17. A thin film magnetoresistive transducer assembly, suitable for detecting signals recorded on narrow tracks of an associated medium, said recorded signals providing a magnetic signal field in a first direction, comprising in combination:

- a substrate made of a first nonmagnetic nonconductive material having a flat smooth planar surface;
- a first magnetoresistive layer of a magnetic conductive material deposited on said planar surface;
- a second magnetoresistive layer of substantially identical dimensions and magnetic and electric properties with said first magnetoresistive layer and coextensive therewith;
- a second layer of nonmagnetic nonelectric material deposited on said first magnetoresistive layer and separating said first and second magnetoresistive layers from each-other said second layer of nonmagnetic nonconductive material having a thickness selected to prevent exchange coupling between the respective magnetoresistive layers while allowing magnetostatic coupling therebetween;
- said respective first and second magnetoresistive layers being deposited to have an easy axis of magnetization in a second direction perpendicular to said first direction, said first and second direction defining a plane parallel with said planar surface; and
- means connected to opposite ends of said magnetoresistive layers to provide a D.C. sense current flow in the same direction through both said magnetoresistive layers and substantially in parallel with the first direction.

18. The thin film magnetoresistive transducer assembly of claim 17 further comprising a layer of nonmagnetic conductive material adjacent to and substantially coextensive with said magnetoresistive layers, a third layer of nonmagnetic electrically insulating material interposed between one said magnetoresistive layer and said nonmagnetic conductive layer, and a D.C. bias current source coupled to said nonmagnetic conductive layer to provide a D.C. bias field substantially in parallel with said first direction.

* * * * *